United States Patent
Kobayashi

(10) Patent No.: US 9,636,824 B2
(45) Date of Patent: May 2, 2017

(54) TRANSFER SYSTEM

(71) Applicant: DAIHEN Corporation, Osaka-shi, Osaka (JP)

(72) Inventor: Takumi Kobayashi, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

(21) Appl. No.: 14/453,688

(22) Filed: Aug. 7, 2014

(65) Prior Publication Data

US 2015/0045950 A1 Feb. 12, 2015

(30) Foreign Application Priority Data

Aug. 12, 2013 (JP) ................................. 2013-167626

(51) Int. Cl.
| | | |
|---|---|---|
| G05B 19/18 | (2006.01) | |
| B25J 9/16 | (2006.01) | |
| B25J 11/00 | (2006.01) | |
| H01L 21/677 | (2006.01) | |
| H01L 21/68 | (2006.01) | |

(52) U.S. Cl.
CPC ......... B25J 9/1697 (2013.01); B25J 11/0095 (2013.01); H01L 21/67766 (2013.01); H01L 21/681 (2013.01); *G05B 2219/37555* (2013.01); *G05B 2219/40014* (2013.01); *G05B 2219/40082* (2013.01); *G05B 2219/45031* (2013.01); *Y10S 901/09* (2013.01); *Y10S 901/47* (2013.01)

(58) Field of Classification Search
USPC ...... 700/245, 229, 253, 259, 98; 901/30, 47, 901/3; 348/86
See application file for complete search history.

(56) References Cited

U.S. PATENT DOCUMENTS

| | | | | | |
|---|---|---|---|---|---|
| 5,475,797 | A | * | 12/1995 | Glaspy, Jr. | ........ G05B 19/41805 318/567 |
| 5,579,444 | A | * | 11/1996 | Dalziel | .................. B25J 9/1697 382/153 |
| 6,215,897 | B1 | * | 4/2001 | Beer | ...................... H01L 21/681 348/87 |
| 6,882,416 | B1 | * | 4/2005 | Hunter | ............... G01N 21/8851 356/237.4 |

(Continued)

FOREIGN PATENT DOCUMENTS

JP 2011-233745 11/2011

*Primary Examiner* — Ronnie Mancho
(74) *Attorney, Agent, or Firm* — Hamre, Schumann, Mueller & Larson, P.C.

(57) ABSTRACT

A transfer system includes a first station at which a workpiece is placed, a second station which receives the workpiece from the first station, a robot including a holder for holding the workpiece and for transferring the workpiece from the first station to the second station, an image capturing unit for capturing an image of the workpiece that reflects a position of the workpiece in the first station, a first memory unit that stores intended placement position information indicating an intended placement position of the workpiece in the first station, and a deviation calculator that calculates a deviation of the position of the workpiece in the first station relative to the intended placement position. The deviation calculator calculates the deviation based on the image of the workpiece and the intended placement position information.

20 Claims, 17 Drawing Sheets

(56) References Cited

U.S. PATENT DOCUMENTS

| | | | |
|---|---|---|---|
| 7,012,684 B1* | 3/2006 | Hunter | G01N 21/8903 250/559.44 |
| 9,073,211 B2* | 7/2015 | Tanaka et al. | |
| 2002/0068992 A1* | 6/2002 | Hine et al. | 700/229 |
| 2004/0243282 A1* | 12/2004 | Watanabe et al. | 700/259 |
| 2006/0271240 A1* | 11/2006 | Nihei et al. | 700/245 |
| 2011/0288667 A1* | 11/2011 | Noda et al. | 700/98 |
| 2012/0255794 A1* | 10/2012 | Fenske | G01G 19/00 177/1 |
| 2014/0015956 A1* | 1/2014 | Fujikawa et al. | 348/86 |
| 2014/0229005 A1* | 8/2014 | Suzuki | 700/254 |
| 2014/0288706 A1* | 9/2014 | Asahi et al. | 700/250 |
| 2015/0001087 A1* | 1/2015 | Dinneen | H01L 21/67253 205/81 |
| 2015/0012137 A1* | 1/2015 | Mimura | B25J 13/006 700/264 |

\* cited by examiner

FIG.6
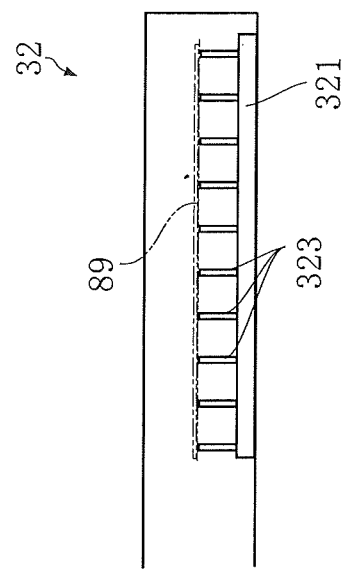
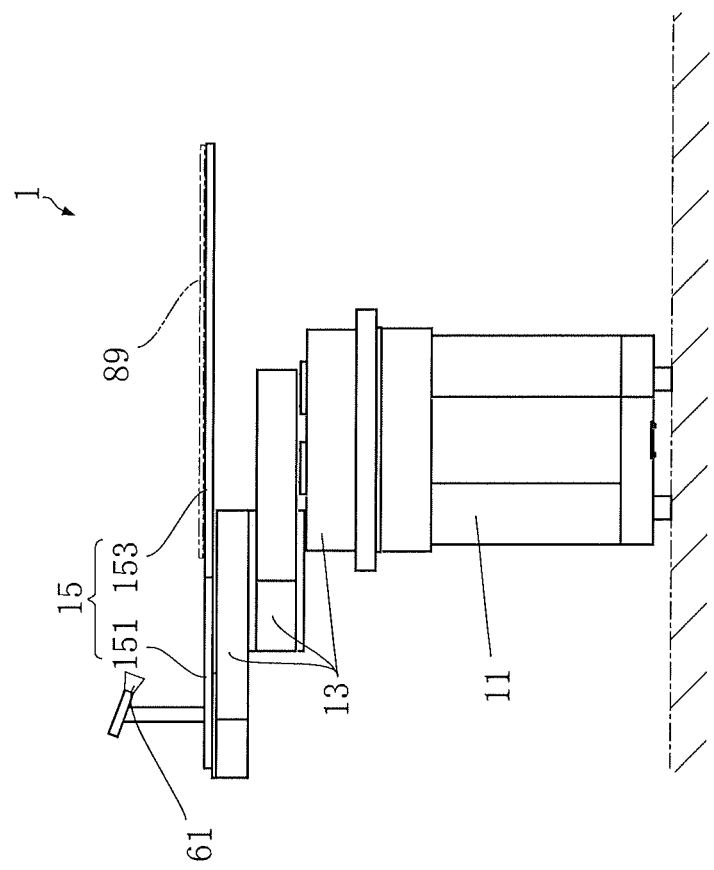

FIG.10
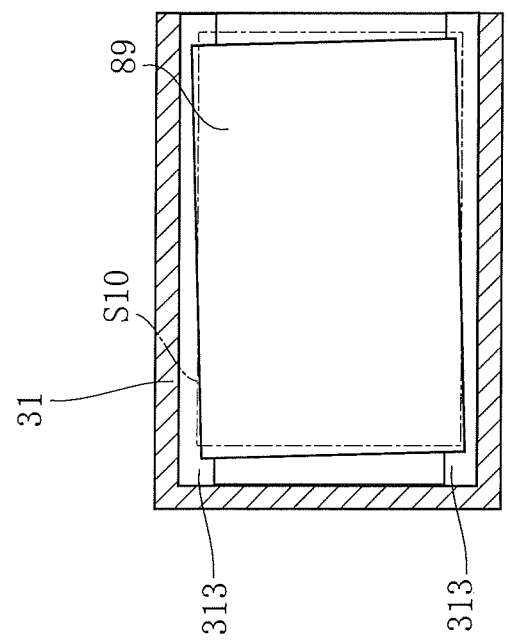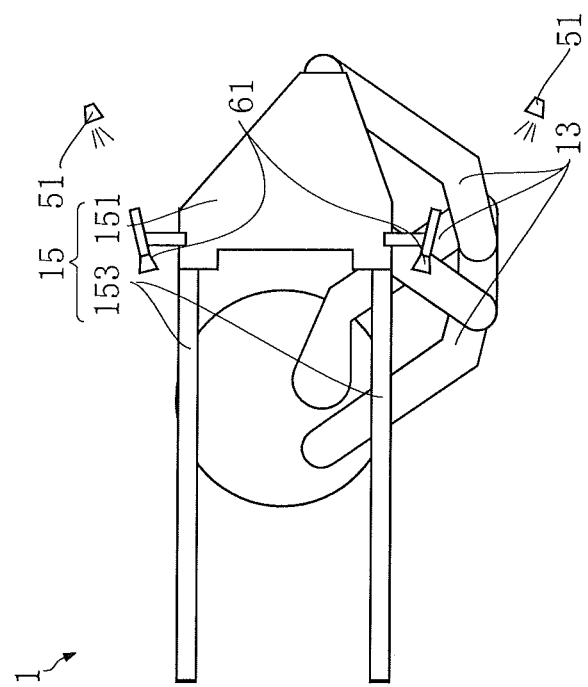

FIG.12
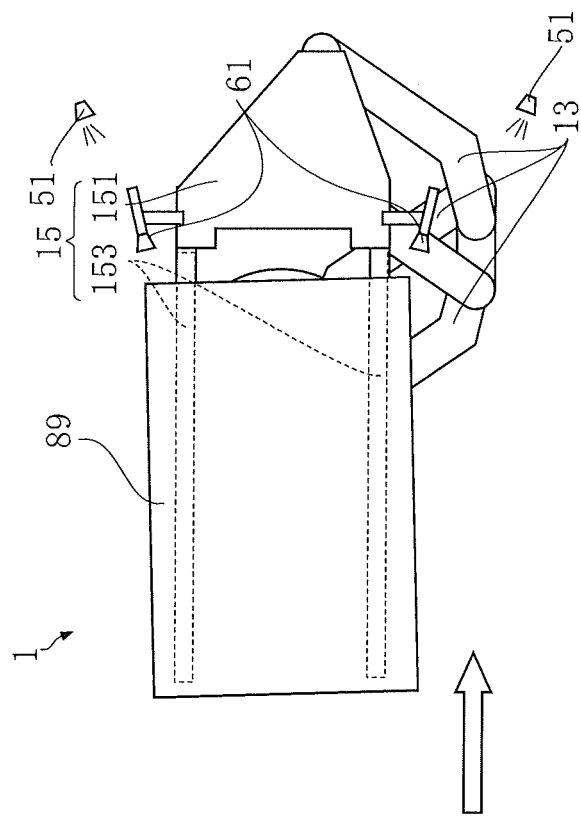
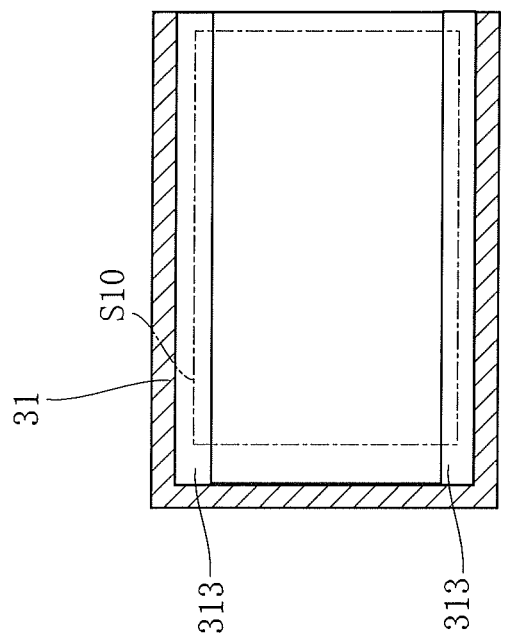

TRANSFER SYSTEM

BACKGROUND OF THE INVENTION

1. Field of the Invention

The present invention relates to a transfer system.

2. Description of the Related Art

Transfer robots for transferring workpieces are conventionally known. An example of such transfer robots is disclosed in JP-A-2011-233745. The transfer robot disclosed in this document has a hand for carrying a workpiece. With the conventional transfer robot, when a workpiece deviates from a desired position in one place, the workpiece is transferred to another place with the same deviation. Thus, the original deviation is not eliminated.

SUMMARY OF THE INVENTION

The present invention has been conceived under the circumstances described above. It is therefore an object of the present invention to provide a workpiece transfer system that is capable of eliminating deviation of the workpiece.

According to a first aspect of the present invention, there is provided a transfer system comprising a first station at which a workpiece is placed, a second station which receives the workpiece from the first station, a robot including a holder for holding the workpiece and for transferring the workpiece from the first station to the second station, an image capturing unit for capturing an image of the workpiece that reflects a position of the workpiece in the first station, a first memory unit that stores intended placement position information indicating an intended placement position of the workpiece in the first station, and a deviation calculator that calculates a deviation of the position of the workpiece in the first station relative to the intended placement position. The deviation calculator calculates the deviation based on the image of the workpiece and the intended placement position information.

Preferably, the transfer system further comprises a second memory unit that stores default position information indicating a position which the holder should assume in placing the workpiece in the second station, and a correction determiner that corrects the default position information based on the deviation to provide corrected position information.

Preferably, the transfer system further comprises an movement controller that generates a movement control signal for controlling movement of the robot, and the movement controller generates the movement control signal based on the corrected position information.

Preferably, the workpiece is rectangular with a first edge, a second edge, a third edge and a fourth edge. The first edge and the second edge form a first corner, whereas the first edge and the third edge form a second corner.

Preferably, the deviation calculator includes a first corner determiner and a computation unit. The first corner determiner generates first corner information based on the image of the workpiece. The first corner information indicates coordinates of the first corner of the workpiece. The computation unit computes the deviation based on the first corner information and the intended placement position information.

Preferably, the deviation calculator further includes a second corner determiner. The second corner determiner generates second corner information based on the image of the workpiece. The second corner information indicates coordinates of the second corner of the workpiece. The computation unit computes the deviation based on the first corner information, the second corner information and the intended placement position information.

Preferably, the first corner determiner includes a first edge determiner, a second edge determiner and a first corner position calculator. The first edge determiner generates a first line signal representing a first straight line that extends along the first edge. The second edge determiner generates a second line signal representing a second straight line that extends along the second edge. The first corner position calculator generates the first corner position information based on the first line signal and the second line signal.

Preferably, the first corner determiner determines that the first corner is chipped when either one or both of the first edge determiner and the second edge determiner does not generate a line signal.

Preferably, the transfer system further comprises a light source for emitting light toward at least one of the edges of the workpiece. The image capturing unit receives light emitted from the light source and reflected by the edge.

Preferably, the image capturing unit and the light source are located on opposite sides of the workpiece thicknesswise thereof for causing the image capturing unit to capture an image of the workpiece.

Preferably, the light source emits light toward the first edge, the second edge, and the first corner of the workpiece.

Preferably, the light source also emits light toward the first edge, the third edge, and the second corner of the workpiece.

Preferably, the image capturing unit captures the image of the workpiece when the workpiece is held by the holder.

Preferably, the image capturing unit is fixed to the holder.

Other features and advantages of the present invention will become more apparent from detailed description given below with reference to the accompanying drawings.

BRIEF DESCRIPTION OF THE DRAWINGS

FIG. 6 is a front view illustrating the robot and the second workpiece storing apparatus with the second workpiece storing apparatus shown in vertical section;

FIG. 10 is a plan view, partially in vertical section, illustrating a step of a workpiece transfer process with the holder of the robot retreated from the first workpiece storing apparatus;

FIG. 12 is a plan view similar to FIG. 10 with the holder of the robot retreated from the first workpiece storing apparatus after holding a workpiece;

DESCRIPTION OF THE PREFERRED EMBODIMENTS

Preferred embodiments of the present invention are described below with reference to the accompanying drawings.

An embodiment of the present invention is described below with reference to FIGS. 1-17.

Figure 1:
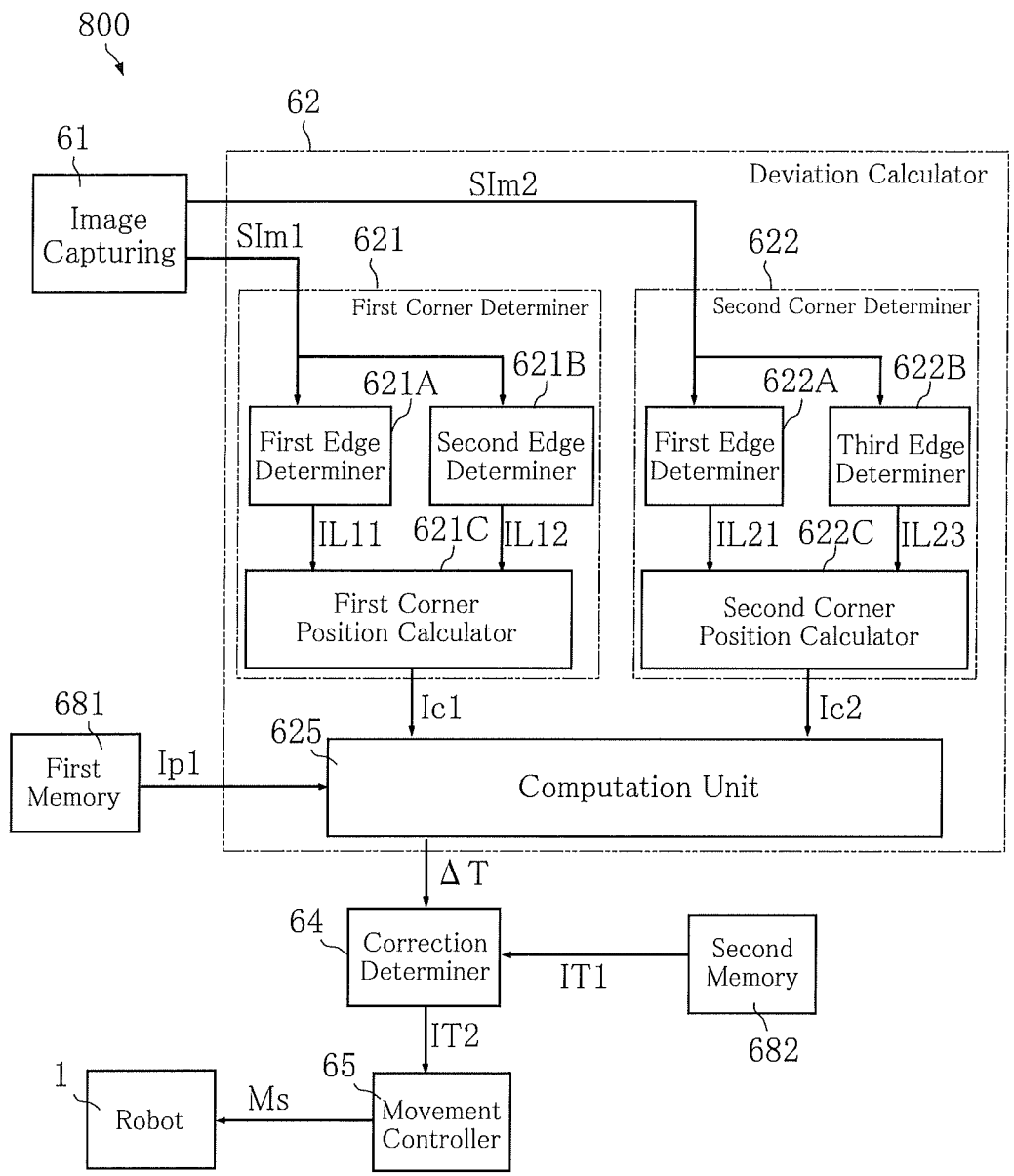
FIG. 1 is a functional block diagram of a transfer system according to an embodiment of the present invention.

FIG. 1 is a functional block diagram of a transfer system according to the first embodiment of the present invention.

The transfer system 800 illustrated in FIG. 1 includes a robot 1, a light source 51 (see FIGS. 2 and 3), an image capturing unit 61, a deviation calculator 62, a correction determiner 64, a movement controller 65, a first memory 681 and a second memory 682.

Figure 2:
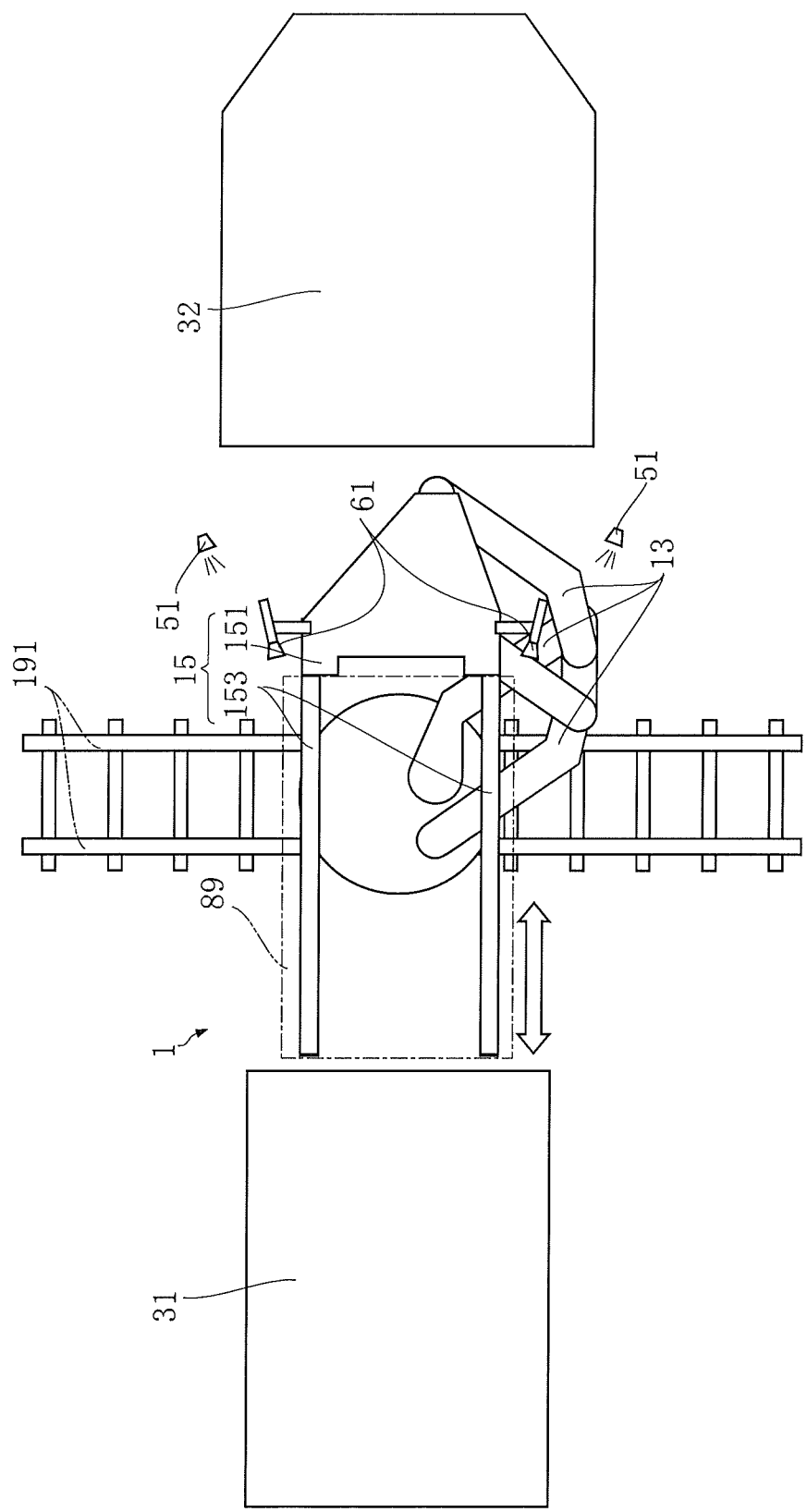
FIG. 2 is a plan view illustrating a robot, a first workpiece storing apparatus and a second workpiece storing apparatus.
Figure 3:
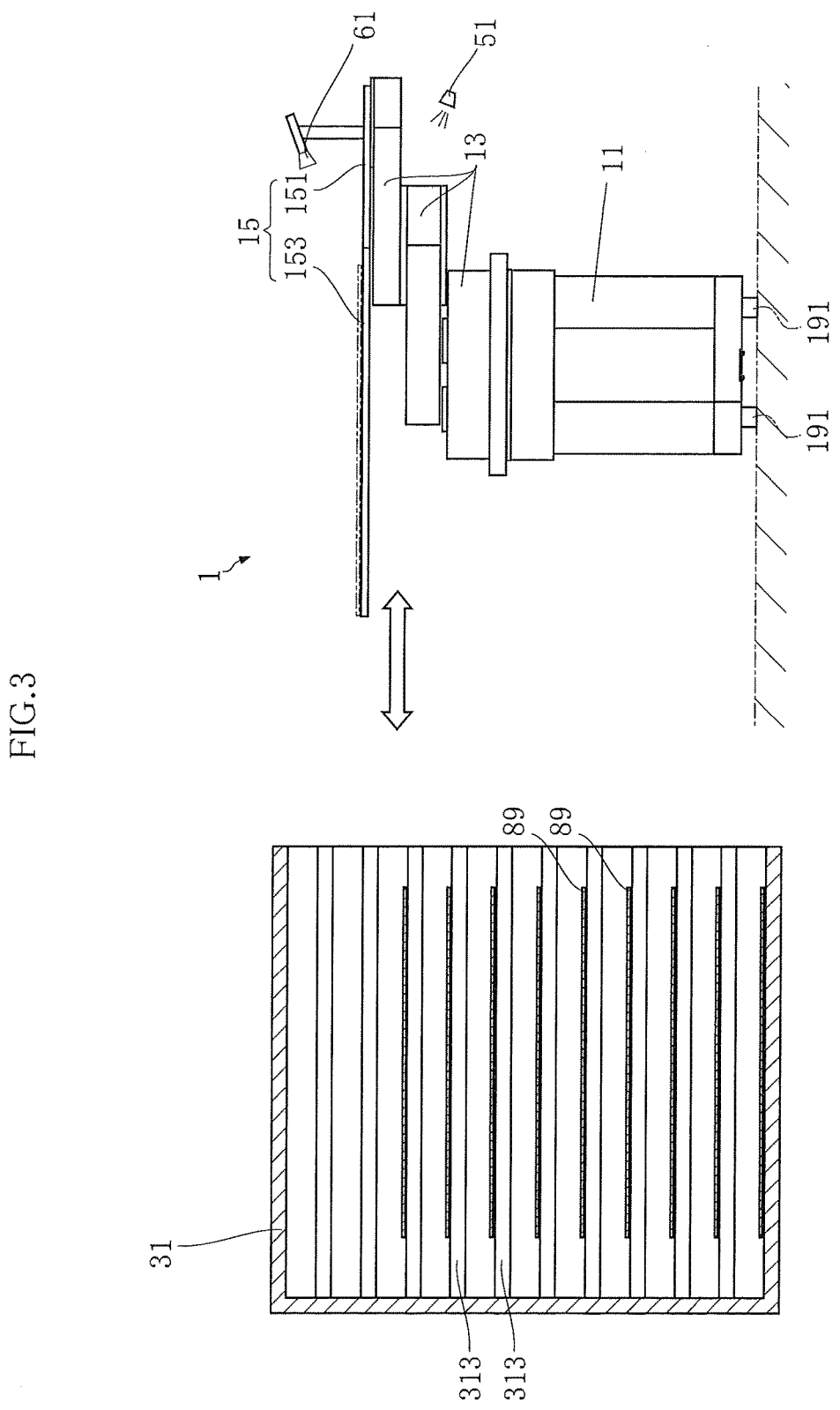
FIG. 3 is a front view illustrating the robot and the first workpiece storing apparatus with the first workpiece storing apparatus shown in vertical section.
Figure 4:
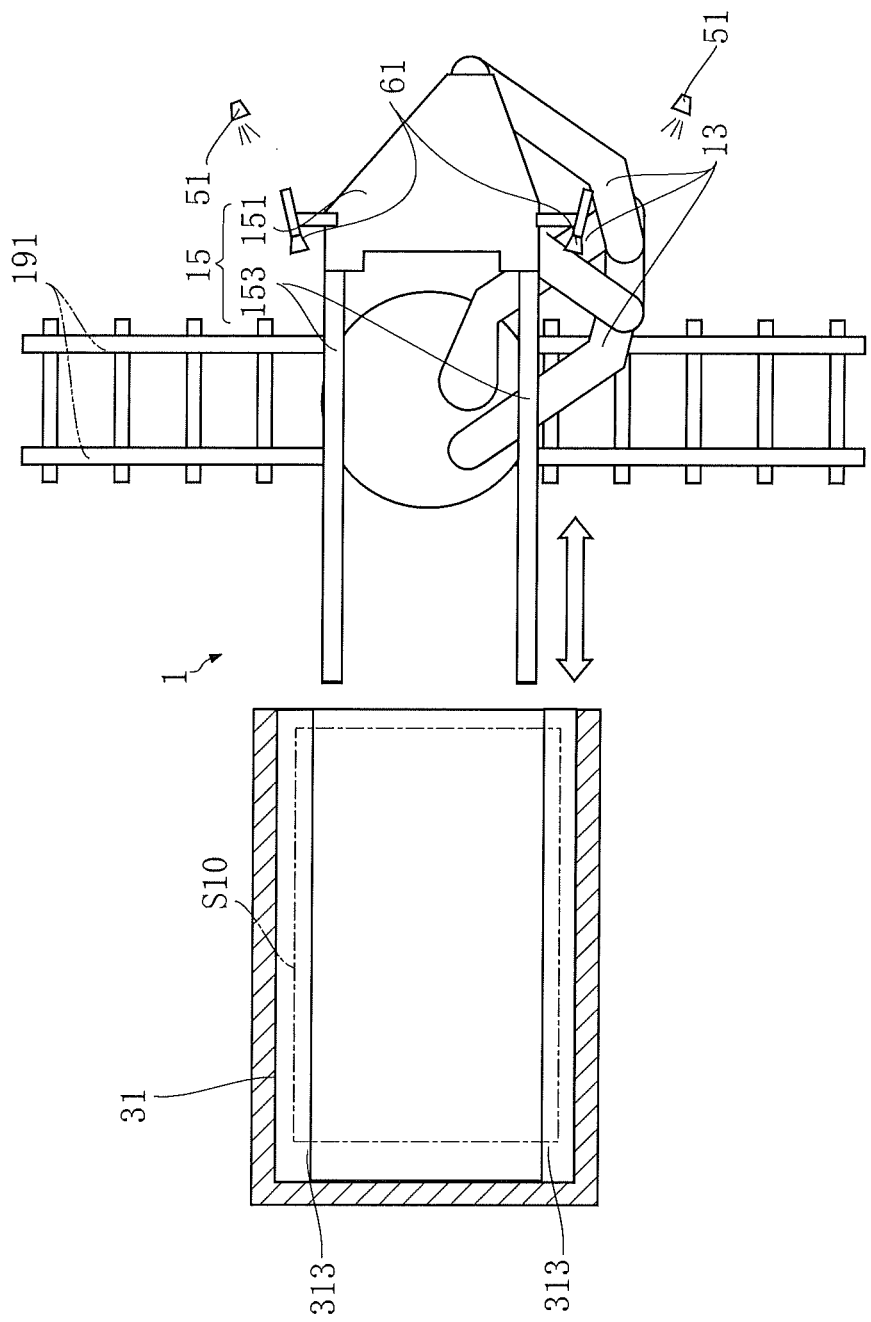
FIG. 4 is a plan view illustrating the robot and the first workpiece storing apparatus with the first workpiece storing apparatus shown in horizontal section.
Figure 5:
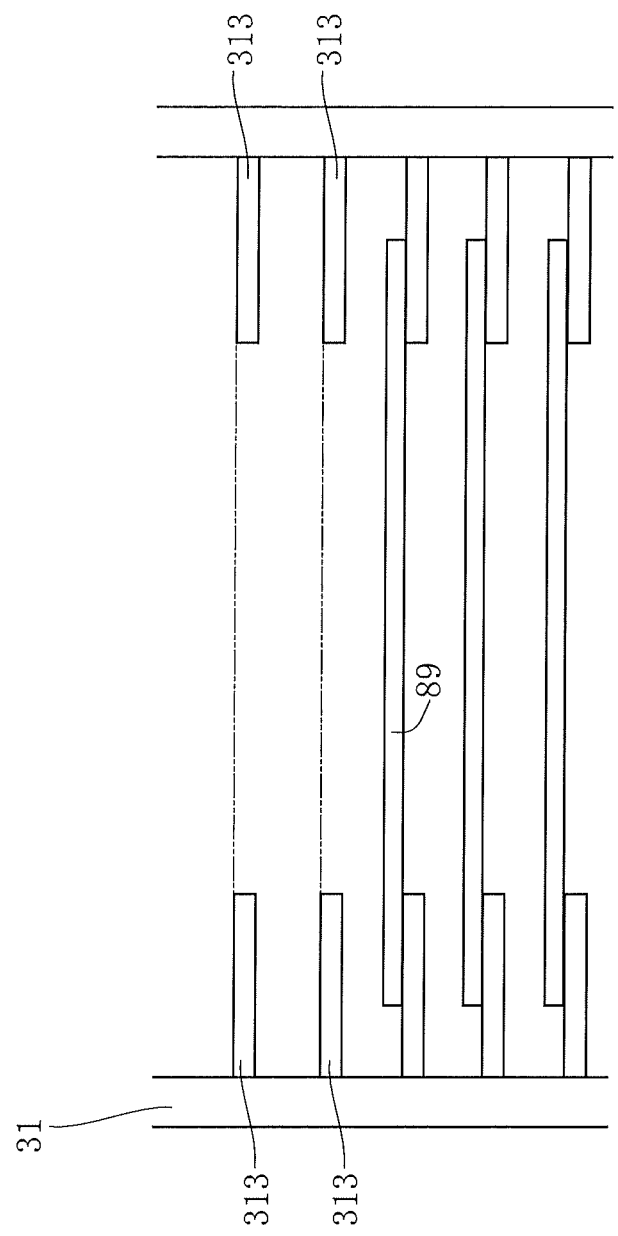
FIG. 5 illustrates a part of the first workpiece storing apparatus as viewed from the robot.

FIG. 2 illustrates the relationship of the robot 1 with respect to a first workpiece storing apparatus 31 (first station) and a second workpiece storing apparatus 32 (second station). FIGS. 3 and 4 illustrate the relationship of the robot 1 with respect to the first workpiece storing apparatus 31. FIG. 5 illustrates a part of the first workpiece storing apparatus 31 as viewed from the robot 1 side.

The robot 1, which is illustrated in FIGS. 1-4, is a transfer robot configured to transfer workpieces 89.

The robot 1 includes a base 11, a movement mechanism 13 and a holder unit 15.

The base 11 provides a support of the robot 1. The base 11 is supported for movement on a floor surface along rails 191. The movement mechanism 13 is linked to the base 11 and the holder 15. The movement mechanism 13 functions to move the holder unit 15 relative to the base 11. The movement mechanism 13 includes a plurality of arms and a rotation mechanism (not described herein). In this embodiment, the movement mechanism 13 moves the holder unit 15 relative to the base 11 horizontally. The movement mechanism 13 is also movable up and down relative to the base 11. The up/down movement of the movement mechanism 13 relative to the base 11 causes the holder unit 15 to move up and down relative to the base 11. The movement mechanism 13 is rotatable relative to the base 11 about a vertical axis. The rotation of the movement mechanism 13 relative to the base 11 causes the holder unit 15 to change its orientation and its horizontal moving direction relative to the base 11.

The holder unit 15 is configured to hold a workpiece 89. The workpiece 89 is transferred to a desired place by appropriately moving the holder unit 15 holding the workpiece 89. In this embodiment, the holder unit 15 is configured to support a workpiece 89 from below. However, the configuration of the holder unit 15 is not limited to this. For instance, the holder unit 15 may be configured to hold a workpiece 89 by sucking the upper surface of the workpiece 89.

In this embodiment, the holder unit 15 includes a wrist 151 and two end effectors 153. The wrist 151 is linked to the movement mechanism 13. In this embodiment, the wrist 151 is generally in the form of a trapezoidal plate. However, the shape of the wrist 151 is not limited to this. Each of the end effectors 153 is in the form of an elongated bar. The end effectors 153 are fixed to the wrist 151. To transfer a workpiece 89, the workpiece 89 is placed on the two end effectors 153.

The first workpiece storing apparatus 31, which is illustrated in FIGS. 2-5, stores workpieces 89. The first workpiece storing apparatus 31 of this embodiment is a cassette that is capable of storing a plurality of (e.g. about 20 to 30) workpieces 89. The first workpiece storing apparatus 31 has first supporting sections 313 for supporting workpieces 89. In this embodiment, each of the first supporting sections 313 is made up of two narrow plates extending in parallel to each other. The workpieces 89 are stored in the first workpiece storing apparatus 31 as placed on the upper surfaces of the first supporting sections 313.

Figure 7:
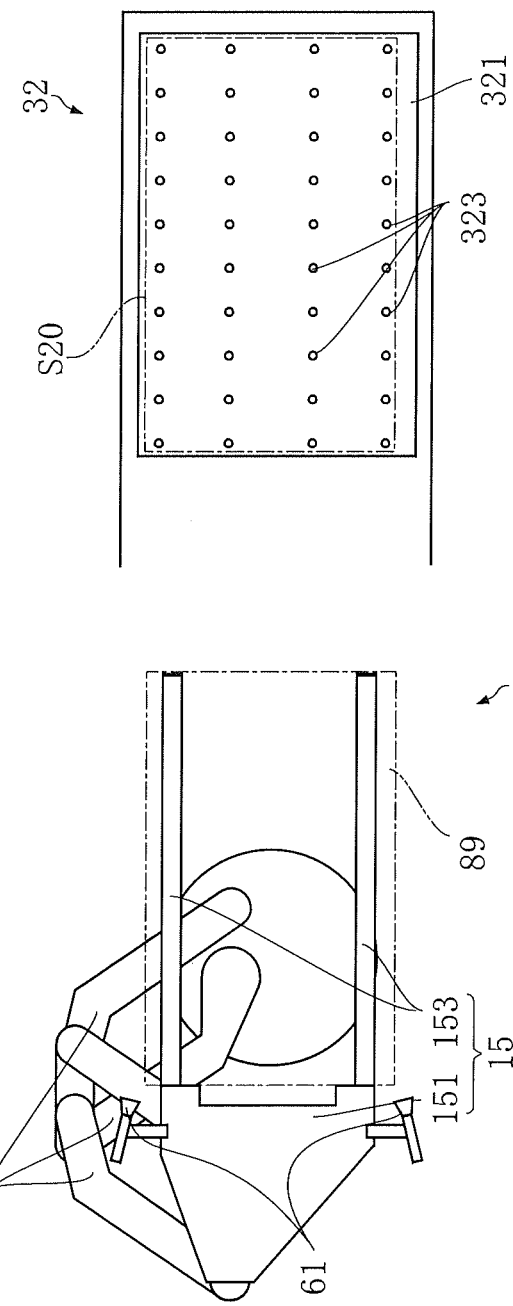
FIG. 7 is a plan view illustrating the robot and the second workpiece storing apparatus with the second workpiece storing apparatus in horizontal section.
Figure 8:
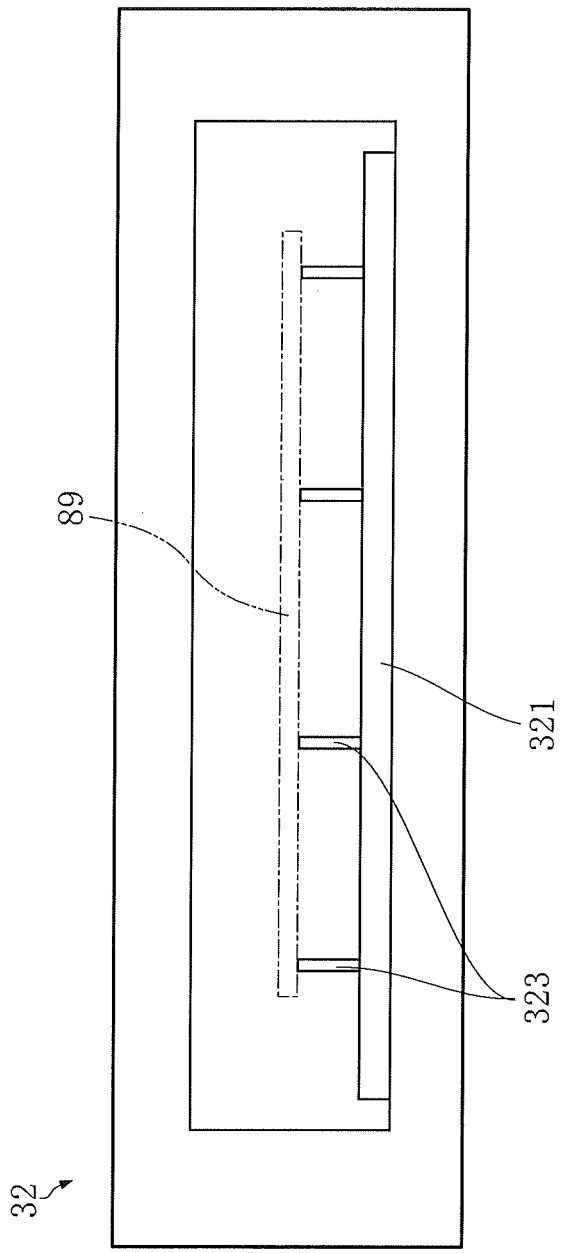
FIG. 8 illustrates a part of the second workpiece storing apparatus as viewed from the robot.

FIGS. 6 and 7 each illustrates the robot 1 and the second workpiece storing apparatus 32. FIG. 8 illustrates a part of the second workpiece storing apparatus 32 as viewed from the robot 1 side.

The second workpiece storing apparatus 32 of this embodiment is a load lock chamber. Workpieces 89 are stored in the load lock chamber before they are transferred to a process chamber to be subjected to appropriate processing. As illustrated in FIGS. 6-8, the load lock chamber as the second workpiece storing apparatus 32 has in it a base plate 321 and a second supporting section 323 for supporting a workpiece 89. The second supporting section 323 is made up of plurality of bars. In the second workpiece storing apparatus 32, the workpiece 89 is stored as placed on the second supporting section 323, i.e., on the upper ends of the bars.

Figure 9:
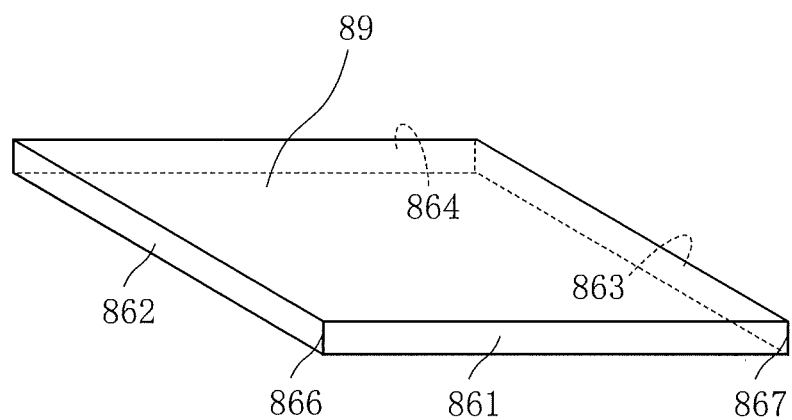
FIG. 9 is a perspective view of the workpiece.

FIG. 9 is a perspective view of a workpiece 89. The workpiece 89 is in the form of a plate and may be a glass panel or a substrate for a liquid crystal flat panel display. A part or entirety of the workpiece 89 may be transparent. The workpiece 89 has a first edge 861, a second edge 862, a third edge 863 and a fourth edge 864. The workpiece 89 has a rectangular shape defined by the first to fourth edges 861-864. The first edge 861 and the second edge 862 form a first corner 866. The first edge 861 and the third edge 863 form a second corner 867.

When the image capturing unit 61 captures an image of a workpiece 89, a light source 51, which is illustrated in FIGS. 1-3, emits light toward selected edges of the workpiece 89. Specifically, the light source 51 emits light toward the first edge 861, the second edge 862 and the third edge 863 of the workpiece 89. In this embodiment, the light source 51 has two lights. The light source 51 will be described in detail later.

The image capturing unit 61, which is illustrated in FIGS. 1-3, may be a CCD camera for example. In this embodiment, the image capturing unit 61 is fixed to the holder unit 15. Thus, when the holder unit 15 moves, the image capturing unit 61 also moves in the same way as the holder unit 15. In the illustrated example, the image capturing unit 61 is linked to the holder 151 with a jig. Since the image capturing unit 61 is linked to the holder 151, the image capturing unit 61 is unlikely to come into improper contact with the first workpiece storing apparatus 31. Alternatively, however, the image capturing unit 61 may be linked to the end effectors 153 instead of the holder 151. The image capturing unit 61 captures an image Im of a workpiece 89 on the holder unit 15. However, the workpiece image Im reflects the position or posture of the workpiece 89 when it was previously located on the relevant first supporting section 313.

The first memory unit 681 stores intended placement position information Ip1 for a workpiece 89 in the first workpiece storing apparatus 31. More specifically, the intended placement position information Ip1 is the information concerning an intended placement position S10 (FIG. 4) of the workpiece 89 on a first supporting section 313 of the first workpiece storing apparatus 31.

The deviation calculator 62 calculates a deviation ΔT of a workpiece. The deviation ΔT is the amount of deviation of the actual position of the workpiece 89 on the first supporting section 313 from the intended placement position S10. The deviation calculator 62 calculates the deviation ΔT based on the workpiece images Im and the intended placement position information Ip1. The deviation calculator 62 will be described in greater detail later.

The second memory unit 682 stores default position information IT1 for the holder unit 15 that holds a workpiece 89 at the time of transferring to the second workpiece storing apparatus 32. More specifically, the default position information IT1 is the information concerning the default position of the holder unit 15 when the workpiece 89 without any deviation is to be placed onto the second supporting section 323.

The correction determiner 64 corrects the default position information IT1 based on the deviation ΔT of the workpiece 89 calculated by the deviation calculator 62, thereby providing corrected position information IT2. The correction determiner 64 sends the corrected position information IT2 to the movement controller 65.

The movement controller 65 controls the movement of the robot 1. Specifically, the movement controller 65 controls the movement of the holder unit 15. The movement controller 65 generates a movement control signal Ms for controlling the movement of the robot 1. In this embodiment, the movement control signal Ms is generated based on the corrected position information IT2. The robot 1 operates in accordance with the movement control signal Ms.

The transfer system 800 described above may be configured to operate in the following manner.

First, the operation of the holder unit 15 of the robot 1 in holding a workpiece 89 placed on the first supporting section 313 is described below. As illustrated in FIG. 10, the holder unit 15 is initially located at a position retreated from the first workpiece storing section 31. As is clear from FIG. 10, the position of the workpiece 89 on the first supporting section 313 deviates from the intended placement position S10. Specifically, the position of the workpiece 89 deviates from intended placement position S10 in a holder moving direction and in a direction transversely of the holder moving direction. Further, the workpiece 89 also deviates angularly from the intended placement position S10 due to rotation about a vertical axis. Such deviation of the workpiece 89 may be caused by previous transportation of the first workpiece storing apparatus 31 (cassette) for example.

Figure 11:
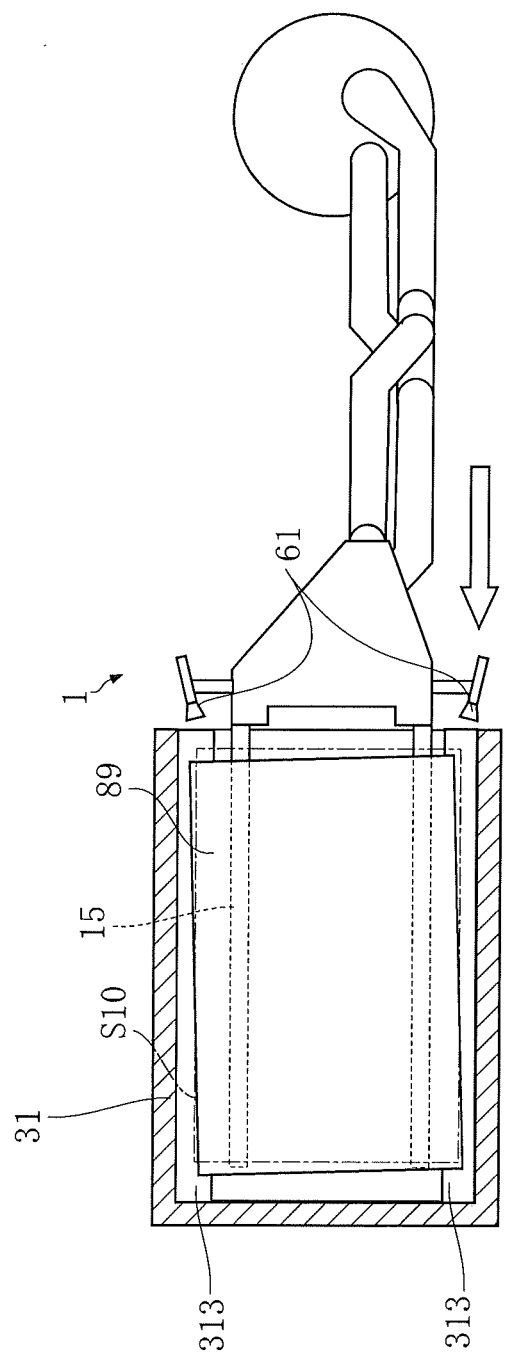
FIG. 11 is a plan view similar to FIG. 10 with the holder of the robot advanced into the first workpiece storing apparatus.

Then, as illustrated in FIG. 11, the holder unit 15 is moved toward the first supporting section 313 (advanced) so that the holder unit 15 is located under the workpiece 89. Then, the holder unit 15 is raised, thereby supporting the workpiece 89 on the holder unit 15. Then, as illustrated in FIG. 12, the holder unit 15 supporting the workpiece 89 is moved away from first supporting section 313, i.e., retreated from the first supporting section 313. The workpiece 89 is still deviated on the holder unit 15 in the same way as it was on the first supporting section 313.

In this embodiment, the image capturing unit 61 captures an image of the workpiece 89, and the captured image is utilized to obtain corrected position information IT2. The corrected position information IT2 is used in placing the workpiece 89 on the second supporting section 323 at a precisely intended placement position S20 (FIG. 7). This process is performed as follows.

Figure 13:
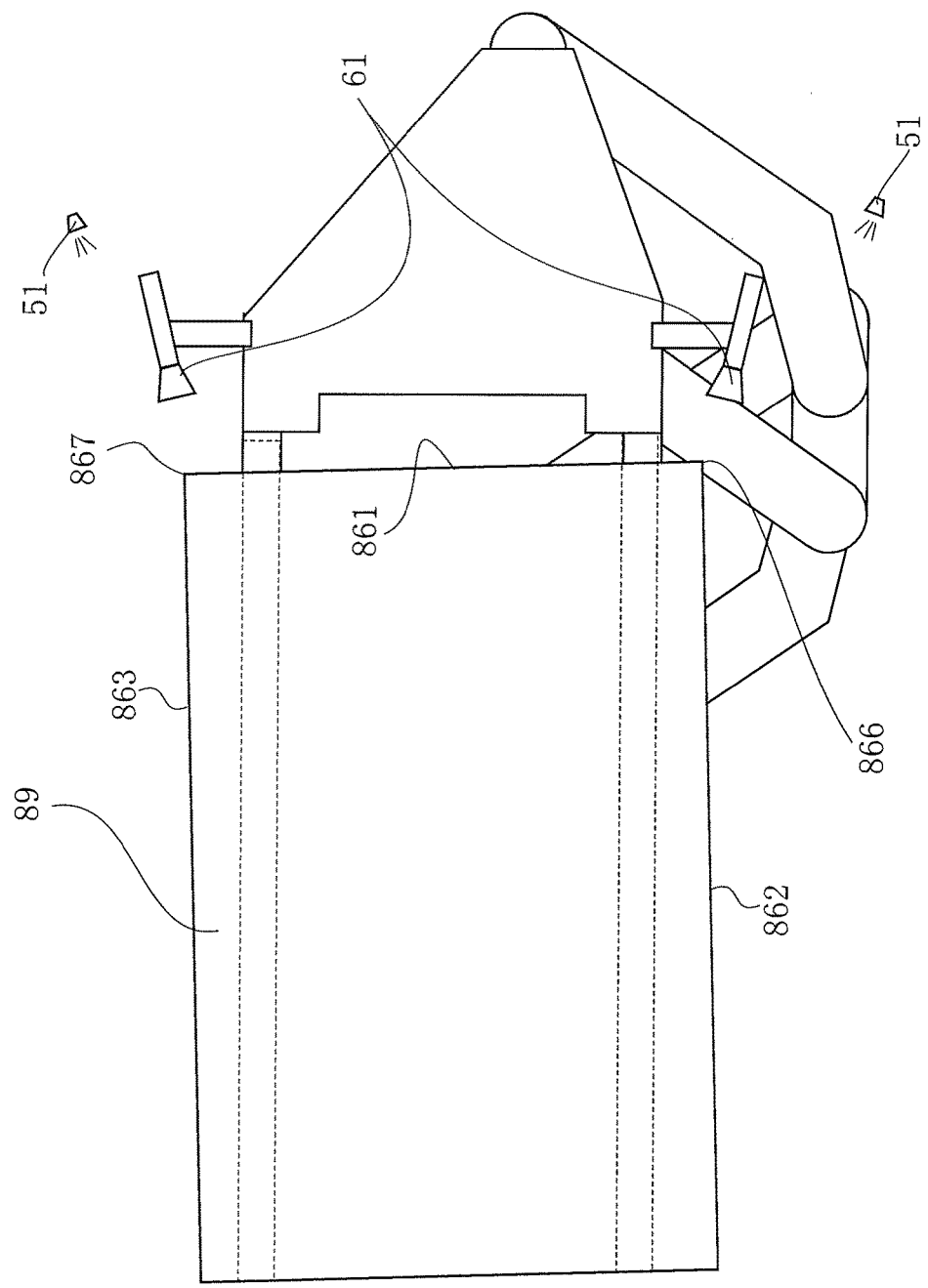
FIG. 13 illustrates an enlarged plan view showing the robot that is holding the workpiece.
Figure 14:
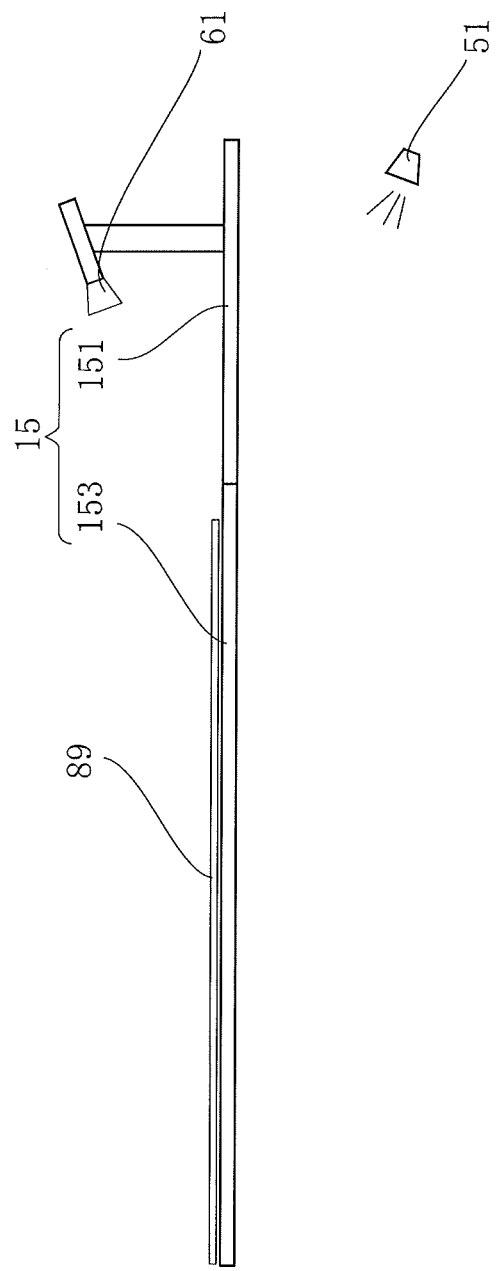
FIG. 14 is an enlarged front showing the holder of the robot.
Figure 15:
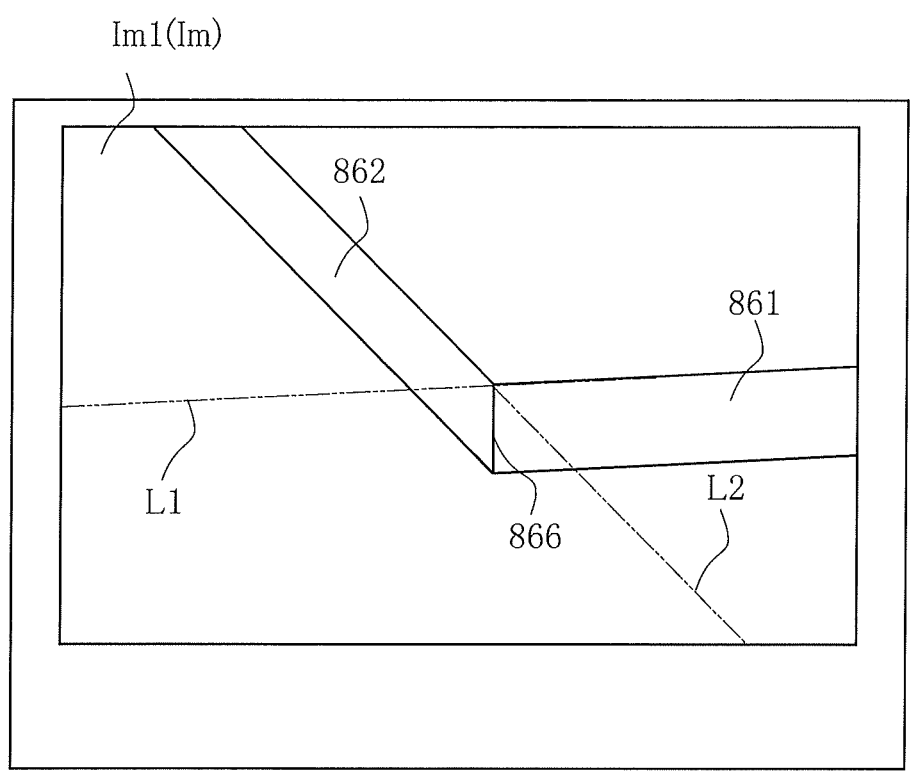
FIG. 15 illustrates an example of a first corner image.
Figure 16:
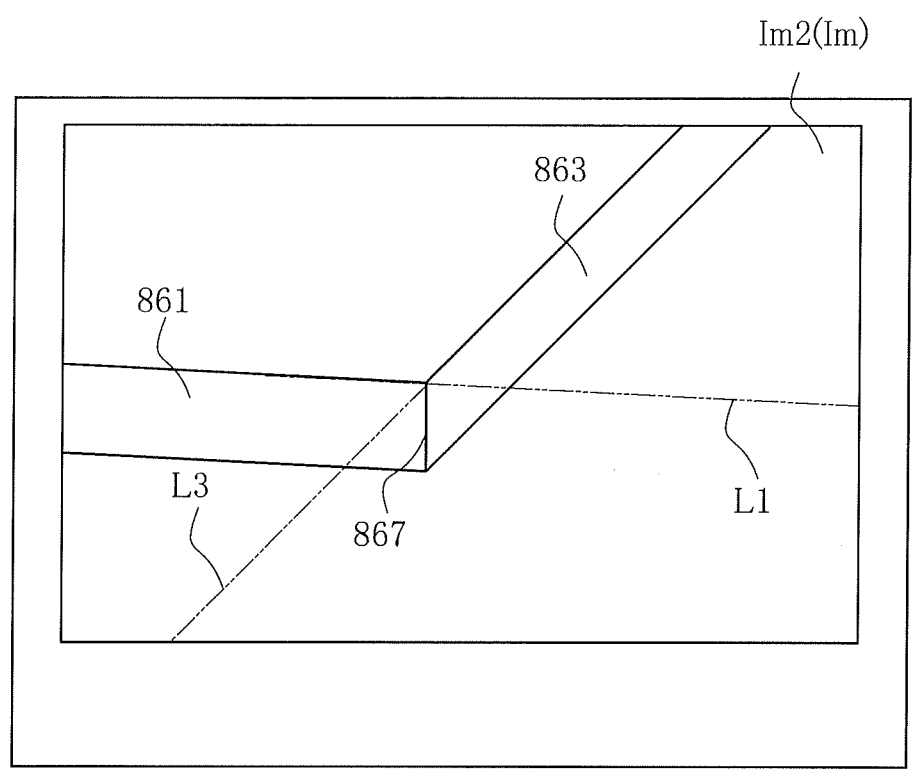
FIG. 16 illustrates an example of a second corner image.

FIG. 13 illustrates a part of FIG. 12 as enlarged. FIG. 14 is a front view of the structure illustrated in FIG. 12.

As illustrated in FIG. 14, when the image capturing unit 61 captures an image of the workpiece 89, the image capturing unit 61 and the light source 51 are located above and below the holder 15 (and the workpiece 89 supported thereon), respectively. The light source 51 emits light toward the first corner 866, the second corner 867, the first edge 861, the second edge 862 and the third edge 863 of the workpiece 89. Specifically, one of the two lights of the light source 51 emits light toward the first edge 861, the second edge 862 and the first corner 866, whereas the other light emits light toward the first edge 861, the third edge 863 and the second corner 867.

The image capturing unit 61 captures an image of the workpiece 89 (workpiece image Im). In particular, in this embodiment, the image capturing unit 61 receives the light emitted from the light source 51 and reflected by the three edges (the first edge 861, the second edge 862, the third edge 863) of the workpiece 89. By receiving the light reflected by the workpiece 89, the image capturing unit 61 easily recognizes the workpiece 89. In this embodiment, the image capturing unit 61 captures an image of the workpiece 89 from diagonally above. Alternatively, the image capturing unit 61 may capture an image of the workpiece 89 without using the light source 51.

In this embodiment, the image capturing unit 61 captures a first corner image Im1 (see FIG. 15) and a second corner image Im2 (see FIG. 16), as the workpiece image Im. The first corner image Im1 is an image fraction that contains the first corner 866 of the workpiece 89. The second corner image Im2 is an image fraction that contains the second corner 867 of the workpiece 89. In this embodiment, the image capturing unit 61 has two cameras, one of which captures a first corner image Im1 and the other of which captures a second corner image Im2. The image capturing unit 61 outputs a first image signal SIm1 corresponding to the first corner image Im1 and a second image signal SIm2 corresponding to the second corner image Im2 for feeding to the deviation calculator 62.

In this embodiment, the deviation calculator 62 includes a first corner determiner 621, a second corner determiner 622 and a computation unit 625.

The first corner determiner 621 receives a first image signal SIm1 from the image capturing unit 61. The first corner determiner 621 outputs a first corner position signal Ic1 based on the first corner image Im1. The first corner position signal Ic1 represents the coordinates (local coordinates) of the first corner 866 of the workpiece 89.

The first corner determiner 621 includes a first edge determiner 621A, a second edge determiner 621B and a first corner position calculator 621C.

The first edge determiner 621A receives a first image signal SIm1 from the image capturing unit 61. The first edge determiner 621A output a first line signal IL11 based on the first corner image Im1. The first line signal IL11 represents the information on a first straight line L1 (see FIG. 15) that extends along the first edge 891 of the workpiece 89. In this embodiment, the first line signal IL11 may be a linear function of the first straight line L1 in the first corner image Im1, for example. The first edge determiner 621A sends the obtained first line signal IL11 to the first corner position calculator 621C.

Figure 17:
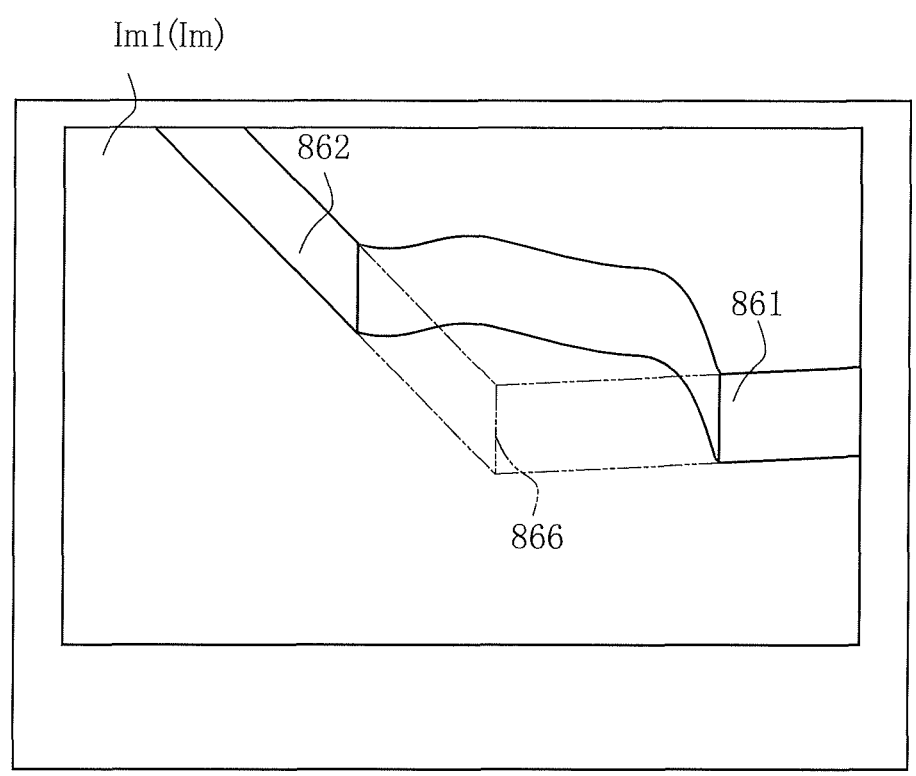
FIG. 17 illustrates an example of a first corner image when that is chipped at a first corner.

When the workpiece 89 is largely chipped at the first corner 866 as illustrated in FIG. 17, the first edge determiner 621A may not be able to obtain a first line signal IL11 due to halation of light impinging on the first edge 861 and the second edge 862. When the first edge determiner 621A cannot obtain a first line signal IL11, the first edge determiner 621A determines that the workpiece 89 is largely chipped at the first corner 866.

The second edge determiner 621B receives a first image signal SIm1 from the image capturing unit 61. The second edge determiner 621B outputs a second line signal IL12 based on the first corner image Im1. The second line signal IL12 represents the information on a second straight line L2 (see FIG. 15) that extends along the second edge 892 of the workpiece 89. In this embodiment, the second line signal IL12 may be a linear function of the second straight line L2 in the first corner image Im 1, for example. The second edge determiner 621B sends the obtained second line signal IL12 to the first corner position calculator 621C.

Similarly to the first edge determiner 621A, when the second edge determiner 621B cannot obtain a second line signal IL12, the second edge determiner 621B determines that the workpiece 89 is chipped at the first corner 866.

The first corner position calculator 621C receives a first line signal IL11 and a second line signal IL12 to generate a first corner position signal Ic1. Specifically, in this embodiment, the first corner position calculator 621C obtains a first corner position signal Ic1 by calculating the point of intersection of the first straight line L1 and the second straight line L2. In this embodiment, the first corner position signal Ic1 corresponds to the coordinates of the first corner 866 in the world coordinate system. The world coordinates of the first corner 866 may be obtained by calculating the local coordinates of the first corner 866 of the first corner image Im1 and then converting the local coordinates into those in the world coordinate system.

The second corner determiner 622 receives a second image signal SIm2 from the image capturing unit 61. The second corner determiner 622 outputs a second corner position signal Ic2 based on the second corner image Im2. The second corner position signal Ic2 represents the information on the coordinates (local coordinates) of the second corner 867 of the workpiece 89.

The second corner determiner 622 includes a first edge determiner 622A, a third edge determiner 622B and a second corner position calculator 622C.

The first edge determiner 622A receives a second image signal SIm2 from the image capturing unit 61. The first edge determiner 622A generates a first line signal IL21 based on the second corner image Im2. The first line signal IL21 represents the information on a first straight line L1 (see FIG. 16) that extends along the first edge 891 of the workpiece 89. In this embodiment, the first line signal IL21 is a linear function of the first straight line L1 in the second corner image Im2, for example. The first edge determiner 622A sends the obtained first line signal IL21 to the second corner position calculator 622C.

Similarly to the first edge determiner 621A, when the first edge determiner 622A cannot obtain a first line signal IL21, the first edge determiner 622A determines that the workpiece 89 is chipped at the second corner 867.

The third edge determiner 622B receives a second image signal SIm2 from the image capturing unit 61. The third edge determiner 622B generates a third line signal IL23 based on the workpiece image Im (specifically, the second corner image Im2). The third line signal IL23 represents the information on a third straight line L3 (see FIG. 16) that extends along the third edge 893 of the workpiece 89. In this embodiment, the third line signal IL23 is a linear function of the third straight line L3 in the second corner image Im2. The third edge determiner 622B sends the obtained third line signal IL23 to the second corner determiner 622C.

Similarly to the first edge determiner 622A, when the third edge determiner 622B cannot obtain a third line signal IL23, the third edge determiner 622B determines that the workpiece 89 is chipped at the second corner 867.

The second corner position calculator 622C receives a first line signal IL21 and a third line signal IL23 to generate a second corner position signal Ic2. Specifically, in this embodiment, the second corner position calculator 622C obtains a second corner position signal Ic2 by calculating the point of intersection of the first straight line L1 and the third straight line L3. In this embodiment, the second corner position signal Ic2 corresponds to the coordinates of the second corner 867 in the world coordinate system. The world coordinates of the second corner 867 may be obtained by calculating the local coordinates of the second corner 867 of the second corner image Im2 and then converting the local coordinates into those in the world coordinate system.

The first corner position calculator 621C and the second corner position calculator 622C send the first corner position signal Ic1 and the second corner position signal Ic2 to the computation unit 625. The computation unit 625 calculates a deviation ΔT of the workpiece 89 based on the first corner position signal Ic1, the second corner position signal Ic2 and the intended placement position information Ip1. The deviation ΔT refers to a positional or postural deviation of the workpiece 89 from the intended placement position S10 in the x- and/or y-directions in the ordinate system, as well as an angular deviation of the workpiece 89 that may result from rotation thereof about a vertical axis. The computation unit 625 sends the obtained deviation ΔT of the workpiece 89 to the correction determiner 64.

Upon receiving the deviation ΔT, the correction determiner 64 makes a correction of the default position information IT1 based on the deviation ΔT, to output corrected position information IT2 for placing the workpiece 89 precisely at the intended placement position S20 (FIG. 7). The correction determiner 64 sends the obtained corrected position information IT2 to the movement controller 65.

In this way, based on the image of the workpiece 89 captured by the image capturing unit 61, the corrected position information IT2 is calculated.

With the workpiece 89 supported on the holder unit 15, the base 11 of the robot 1 is rotated, and the holder unit 15 is advanced toward the second supporting section 323. Then, the holder unit 15 is lowered, so that the workpiece 89 is supported on the second supporting section 323 (see FIGS. 6 and 7). At this time, the position or posture of the holder unit 15 is controlled based on the corrected position information IT2 so that the workpiece 89 is placed precisely at the intended placement position S20. Thereafter, the holder unit 15 is retreated from the second supporting section 323.

The above-described embodiment of the present invention has the following advantages.

According to this embodiment, the transfer system 800 includes the image capturing unit 61, the first memory unit 681 and the deviation calculator 62. The image capturing unit 61 captures an image Im of the workpiece 89 which represents the position or posture of the workpiece 89 when it was previously located on the first supporting section 313. The first memory unit 681 stores intended placement position information Ip1 that represents an intended placement position S10 (FIG. 4) of the workpiece 89 on the first supporting section 313. The deviation calculator 62 calculates a deviation ΔT of the position of the workpiece 89 from the intended placement position S10 based on the workpiece images Im and the intended placement position information Ip1. Thus, the workpiece 89 may be placed precisely at the intended placement position S20 (FIG. 7) on the second supporting section 323 by utilizing the deviation ΔT. In this way, a deviation of the workpiece 89 on the second supporting section 323 may be eliminated.

Since a deviation of the workpiece 89 is eliminated in this way, the subsequent process such as formation of a wiring pattern on the workpiece 89 in e.g. a process chamber (not shown) may be performed precisely at a proper position of the workpiece 89.

In this embodiment, the deviation calculator 62 includes the first corner determiner 621 and the computation unit 625. The first corner determiner 621 computes a first corner position signal Ic1 based on the workpiece image Im (first corner image Im1). The first corner position signal Ic1 indicates the coordinates of the first corner 866 of the workpiece 89. The computation unit 625 computes a deviation ΔT based on the first corner position signal Ic1 and the intended placement position information Ip1. When the position of the workpiece 89 deviates from the intended position, the position of the first corner 866 also deviates. Thus, the combination of the first corner determiner 621 and the computation unit 625 is useful for computing the positional deviation of the workpiece 89 from the intended placement position S10.

Similarly, the deviation calculator 62 further includes the second corner determiner 622. The second corner determiner 622 computes a second corner position signal Ic2 based on the workpiece image Im (second corner image Im2). The second corner position signal Ic2 indicates the coordinates of the second corner 867 of the workpiece 89. The computation unit 625 computes a deviation ΔT based on the second corner position signal Ic2 and the intended placement position information Ip1. When the position of the workpiece 89 deviates from the intended position, the position of the second corner 867 also deviates. Thus, the combination of the second corner determiner 622 and the computation unit 625 is also useful for computing a positional deviation of the workpiece 89 relative to the intended placement position S10. Moreover, an angular deviation of the workpiece 89 can also be computed by utilizing both of the first corner position signal Ic1 and the second corner position signal Ic2.

In this embodiment, the first corner determiner 621 includes the first edge determiner 621A, the second edge determiner 621B and the first corner position calculator 621C. The first edge determiner 621A generates a first line signal IL11 representing the first straight line L1 that extends along the first edge 891, based on the workpiece image Im. The second edge determiner 621B generates a second line signal IL12 representing the second straight line L2 that extends along the second edge 892, based on the workpiece image Im. The first corner position calculator 621C generates the first corner position signal Ic1 based on the first line signal IL11 and the second line signal IL12. Thus, since the first line signal IL11 and the second line signal IL12 can be obtained even when the workpiece 89 has a small chip at the first corner 866, a deviation ΔT can be computed for precisely placing the workpiece 89 at the intended placement position S20 on the second supporting section 323.

In this embodiment, the first edge determiner 621A determines that the workpiece 89 is critically chipped at the first corner 866 when it cannot generate a first line signal IL11. Similarly, the second edge determiner 621B determines that the workpiece 89 critically chipped at the first corner 866 when it cannot generate a second line signal IL12. Since critical chipping at the first corner 866 of the workpiece 89 can be detected in this way, the workpiece 89 with such a chip can be marked as a defective workpiece or may be disposed of in the later step.

Similarly to the first edge determiner 621A, the other first edge determiner 622A and the third edge determiner 622B can detect critical chipping at the second corner 867.

In this embodiment, the transfer system 800 incorporates the light source 51 that emits light toward selected edges (the first edge 861, the second edge 862 and the third edge 863) of the workpiece 89. The image capturing unit 61 receives the light emitted from the light source 51 and reflected at the edges. The provision of the light source 51 is suitable for reliably capturing a workpiece image Im particularly when a part or entirety of the edges of the workpiece 89 is transparent.

In this embodiment, the image capturing unit 61 and the light source 51 are arranged on the opposite sides of the workpiece 89 thicknesswise thereof. This arrangement is suitable for reliably capturing a workpiece image Im.

The present invention is not limited to the foregoing embodiment. The specific structure of each part of the present invention can be varied in design in many ways.

Although the image capturing unit 61 captures an image of the workpiece 89 after the workpiece 89 is held by the holder unit 15 in the foregoing embodiment, the present invention is not limited to this. That is, the image capturing unit 61 may be configured to capture an image of the workpiece 89 when the workpiece 89 is on the first supporting section 313.

Although the image capturing unit 61 is fixed to the holder unit 15 in the foregoing embodiment, the present invention is not limited to this arrangement. For instance, the image capturing unit 61 may be fixed to the first workpiece storing apparatus 31.

Unlike the foregoing embodiment, the image capturing unit 61 may be arranged on the lower side of the first supporting section 313, whereas the light source 51 may be arranged on the upper side of the first supporting section 313. In this way, the image capturing unit 61 and the light source 51 can be arranged on the opposite sides of the workpiece 89 thicknesswise thereof.

Although the image capturing unit 61 has two cameras in the foregoing embodiment, the present invention is not limited to this. For instance, the image capturing unit 61 may have a single wide-angle camera that captures an image containing both of the first corner 866 and the second corner 867.

In the foregoing embodiment, the first supporting section 313 is a part of a cassette and the second supporting section is a part of a load lock chamber. However, the present invention is not limited to this arrangement. For instance, the first supporting section may be a part of a load lock chamber, and the second supporting section may be a part of a process chamber.

The invention claimed is:

1. A transfer system comprising:
   a first station at which a workpiece is placed;
   a second station separate from the first station and which receives the workpiece from the first station;
   a robot including a holder for holding the workpiece and for transferring the workpiece from the first station to the second station;
   an image capturing unit for capturing an image of the workpiece that reflects a position of the workpiece in the first station;

a first memory unit that stores intended placement position information indicating an intended placement position of the workpiece that is predetermined relative to the first station, the intended placement position being determined before the workpiece is placed on the first station; and a deviation calculator that calculates a deviation of the position of the workpiece in the first station relative to the intended placement position, wherein the deviation calculator calculates the deviation based on the image of the workpiece and the intended placement position information.

2. The transfer system according to claim 1, further comprising:

a second memory unit that stores default position information indicating a position which the holder should assume in placing the workpiece in the second station; and a correction determiner that corrects the default position information based on the deviation to provide corrected position information.

3. The transfer system according to claim 2, further comprising an movement controller that generates a movement control signal for controlling movement of the robot, wherein the movement controller generates the movement control signal based on the corrected position information.

4. The transfer system according to claim 1, wherein the workpiece is rectangular with a first edge, a second edge, a third edge and a fourth edge, the first edge and the second edge form a first corner, and the first edge and the third edge form a second corner.

5. The transfer system according to claim 4, wherein the deviation calculator includes a first corner determiner and a computation unit, the first corner determiner generates first corner information based on the image of the workpiece, the first corner information indicating coordinates of the first corner of the workpiece, and the computation unit computes the deviation based on the first corner information and the intended placement position information.

6. The transfer system according to claim 5, wherein the deviation calculator further includes a second corner determiner, the second corner determiner generates second corner information based on the image of the workpiece, the second corner information indicating coordinates of the second corner of the workpiece, and the computation unit computes the deviation based on the first corner information, the second corner information and the intended placement position information.

7. The transfer system according to claim 5, wherein the first corner determiner includes a first edge determiner, a second edge determiner and a first corner position calculator, the first edge determiner generates a first line signal representing a first straight line that extends along the first edge, the second edge determiner generates a second line signal representing a second straight line that extends along the second edge, and the first corner position calculator generates the first corner position information based on the first line signal and the second line signal.

8. The transfer system according to claim 7, wherein the first corner determiner determines that the first corner is chipped when either one or both of the first edge determiner and the second edge determiner does not generate a line signal.

9. The transfer system according to claim 4, wherein the transfer system further comprises a light source for emitting light toward at least one of the edges of the workpiece, and the image capturing unit receives light emitted from the light source and reflected by the edge.

10. The transfer system according to claim 9, wherein the image capturing unit and the light source are located on opposite sides of the workpiece thicknesswise thereof for causing the image capturing unit to capture an image of the workpiece.

11. The transfer system according to claim 9, wherein the light source emits light toward the first edge, the second edge, and the first corner of the workpiece.

12. The transfer system according to claim 11, wherein the light source also emits light toward the first edge, the third edge, and the second corner of the workpiece.

13. The transfer system according to claim 1, wherein the image capturing unit captures the image of the workpiece when the workpiece is held by the holder.

14. The transfer system according to claim 1, wherein the image capturing unit is fixed to the holder.

15. The transfer system according to claim 1, wherein the holder of the robot is fixed in posture with respect to the image capturing unit when the transfer system is in operation.

16. The transfer system according to claim 15, wherein the holder of the robot includes a common wrist and a plurality of end effectors stationarily attached to the common wrist.

17. The transfer system according to claim 1, wherein the first station is configured to hold a plurality of the workpieces parallel to one another.

18. The transfer system according to claim 1, further comprising a light source that illuminates at least a portion of the workpiece.

19. The transfer system according to claim 1, wherein the robot is positioned between the first station and the second station.

20. A transfer system comprising:

a first station at which a workpiece is placed;

a second station which receives the workpiece from the first station;

a robot including a holder for holding the workpiece and for transferring the workpiece from the first station to the second station;

an image capturing unit for capturing an image of the workpiece that reflects a position of the workpiece in the first station;

a first memory unit that stores intended placement position information indicating an intended placement position of the workpiece that is predetermined relative to the first station, the intended placement position being determined before the workpiece is placed on the first station; and a deviation calculator that calculates a deviation of the position of the workpiece in the first station relative to the intended placement position, wherein the deviation calculator calculates the deviation based on the image of the workpiece and the intended placement position information;

the workpiece is rectangular with a first edge, a second edge, a third edge and a fourth edge, the first edge and the second edge form a first corner, and the first edge and the third edge form a second corner;

a light source for emitting light toward at least one of the edges of the workpiece; and the image capturing unit receives light emitted from the light source and reflected by the edge.

* * * * *